(12) United States Patent
Ham et al.

(10) Patent No.: US 9,939,974 B2
(45) Date of Patent: Apr. 10, 2018

(54) CONTACT SENSITIVE DISPLAY DEVICE WITH THIN PROFILE AND LOW EXTERNAL LIGHT REFLECTIVITY

(71) Applicant: LG Display Co., Ltd, Seoul (KR)

(72) Inventors: Yong-Su Ham, Seoul (KR); SuSeok Choi, Seongnam-si (KR); Taeheon Kim, Seoul (KR); YongWoo Lee, Goyang-si (KR); MyungJin Lim, Gonyang-si (KR); Seulgi Choi, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 102 days.

(21) Appl. No.: 14/979,952

(22) Filed: Dec. 28, 2015

(65) Prior Publication Data

US 2016/0188119 A1    Jun. 30, 2016

(30) Foreign Application Priority Data

Dec. 29, 2014   (KR) .................. 10-2014-0192708
Dec. 14, 2015   (KR) .................. 10-2015-0178057

(51) Int. Cl.
*G06F 3/044*   (2006.01)
*H01L 41/113*   (2006.01)
(Continued)

(52) U.S. Cl.
CPC ........... *G06F 3/044* (2013.01); *G02B 5/3083* (2013.01); *G06F 3/016* (2013.01); *H01L 27/323* (2013.01);
(Continued)

(58) Field of Classification Search
CPC .......... G06F 3/016; G06F 3/041; G06F 3/044; G06F 2203/04107; H01L 41/1132;
(Continued)

(56) References Cited

U.S. PATENT DOCUMENTS

2010/0123672 A1   5/2010   Kim
2010/0328053 A1   12/2010  Yeh et al.
(Continued)

FOREIGN PATENT DOCUMENTS

CN   1242096 A   1/2000
CN   101387933 A   3/2009
(Continued)

OTHER PUBLICATIONS

Search Report for Related Application EP 15 202 790.

*Primary Examiner* — Larry Sternbane
(74) *Attorney, Agent, or Firm* — Dentons US LLP (57) ABSTRACT

Provided is a display device. The display device includes a display panel, a contact sensitive device on the display panel, and a linear polarizer on the contact sensitive device. The contact sensitive device includes an electro-active layer which is uniaxially elongated and configured to retard a phase of incident light. Since the display device includes the contact sensitive device having the electro-active layer configured to retard the phase of the incident light, a separate phase retardation film for suppressing external light reflection may be omitted. As a result, the thickness of the display device may be decreased and manufacturing cost of the display device may be reduced.

12 Claims, 7 Drawing Sheets

(51) Int. Cl.
*H01L 41/193* (2006.01)
*H01L 27/32* (2006.01)
*H01L 51/52* (2006.01)
*H01L 41/47* (2013.01)
*G02B 5/30* (2006.01)
*G06F 3/01* (2006.01)

(52) U.S. Cl.
CPC ........ *H01L 41/1132* (2013.01); *H01L 41/193* (2013.01); *H01L 41/47* (2013.01); *H01L 51/5281* (2013.01); *G06F 2203/04107* (2013.01)

(58) Field of Classification Search
CPC ..... H01L 41/193; H01L 27/323; H01L 41/47; H01L 51/5281; G02B 5/3083
See application file for complete search history.

(56) References Cited

U.S. PATENT DOCUMENTS

| | | |
|---|---|---|
| 2013/0147728 A1 | 6/2013 | Lee et al. |
| 2014/0354304 A1 | 12/2014 | Omote et al. |
| 2014/0354905 A1* | 12/2014 | Kitchens ............... G06F 1/3215 349/12 |
| 2016/0077649 A1 | 3/2016 | Ando et al. |
| 2016/0291729 A1* | 10/2016 | Schardt .................. G06F 3/016 |

FOREIGN PATENT DOCUMENTS

| | | |
|---|---|---|
| EP | 2605111 A2 | 6/2013 |
| EP | 2799959 A1 | 11/2014 |
| WO | 2014/192541 A1 | 12/2014 |

\* cited by examiner

CONTACT SENSITIVE DISPLAY DEVICE WITH THIN PROFILE AND LOW EXTERNAL LIGHT REFLECTIVITY

This application claims the priority of Korean Patent Application Nos. 10-2014-0192708 filed on Dec. 29, 2014, and 10-2015-0178057 filed on Dec. 14, 2014, in the Korean Intellectual Property Office, the disclosure of which is incorporated herein by reference for all purposes as if fully set forth herein.

BACKGROUND OF THE INVENTION

Field of the Invention

The present disclosure relates to a display device and a method of manufacturing the same, and more particularly, to a display device including a contact sensitive device.

Discussion of the Related Art

Touch panels for sensing a user's touch input, such as a touch or gesture on the screen of a display device, have been widely used in large display devices such as display devices for public facility and smart TVs, in addition to portable display devices such as smart phones and tablet PCs. Operation types of touch panels include a resistive type, a capacitive type, an optical type, an electromagnetic (EM) type, and the like.

Recently, researches have been conducted on not only the function of sensing a user's touch input but also a haptic effect of transferring a tactile feedback, which is capable of being felt by a user's finger or stylus pen as a feedback to the user's touch input.

The existing haptic effect has been implemented by a method of transferring vibration to the user by using an eccentric motor and the like. However, recently, contact sensitive devices implemented in a film form by using electro-active polymers (EAPs) have been receiving attention.

Since the contact sensitive devices using an EAP is driven by an electrical stimulation, a strong electric field may be applied to an electro-active layer including the EAP. Accordingly, interferences to other constituent elements of the display device may occur by such a strong electric field applied to the electro-active layer.

Meanwhile, with development of portable display devices, consumer expectations for the convenience in the outdoor environment have been increased. Particularly, a problem of reduced visibility caused by a reflection of light input from the outside has emerged, and additional constituent elements such as a phase retardation film have been developed. However, there have been limitations in reducing the weight and thickness of portable display devices, and manufacturing costs have been also increased.

SUMMARY OF THE INVENTION

Accordingly, the present invention is directed to a display device and a method of manufacturing the same that substantially obviate one or more problems due to limitations and disadvantages of the related art.

An advantage of the present invention is to provide a display device that includes a contact sensitive device with thin profile and low external light reflectivity.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

According to an aspect of the present disclosure, there is provided a display device. The display device includes a display panel, a contact sensitive device on the display panel, and a linear polarizer on the contact sensitive device. The contact sensitive device includes an electro-active layer which is uniaxially elongated and configured to retard a phase of incident light. Here, the electro-active layer may be constituted to retard the phase of the incident light by about $\lambda/4$. In addition, the electro-active layer may be made of polyvinylidene fluoride (PVDF)-based polymers. Here, the thickness of the electro-active layer may be 40 μm.

According to another aspect of the present disclosure, there is provided a display device. The display device includes a display panel, a linear polarizer on the display panel, and a contact sensitive device. The contact sensitive device is disposed between the display panel and the linear polarizer and includes an electro-active layer having an elongation axis inclined at a predetermined angle from a polarization axis of the polarizer.

Details of other embodiments will be included in the detailed description of the disclosure and the accompanying drawings.

According to the present disclosure, additional constituent elements such as a separate phase retardation film for minimizing external light reflection may be omitted by retarding the phase of the incident light by using the electro-active layer which is uniaxially elongated to have a refractive index anisotropic property, and as a result, the thickness may be reduced. Further, since the additional constituent elements are omitted, it is effective in cost reduction.

Further, the linear polarizer is disposed between the contact sensitive device and the touch panel and used as a shielding layer. As a result, a phenomenon in which touch signals of the touch panel interfere due to the electric field applied to the electro-active layer can be minimized.

The effects of the present disclosure are not limited to the aforementioned effects, and other various effects are included in the present specification.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

In the following embodiments, an electro-active layer means a layer that transforms its shape when a voltage is applied thereto, and thus, the electro-active layer may release or transfer a vibration.

In the following embodiments, a contact sensitive device means an element capable of transferring a tactile feedback to a user in response to the user's touch on the contact sensitive device.

Hereinafter, various embodiments of the present disclosure will be described in detail, examples of which are illustrated in the accompanying drawings.

Figure 1:
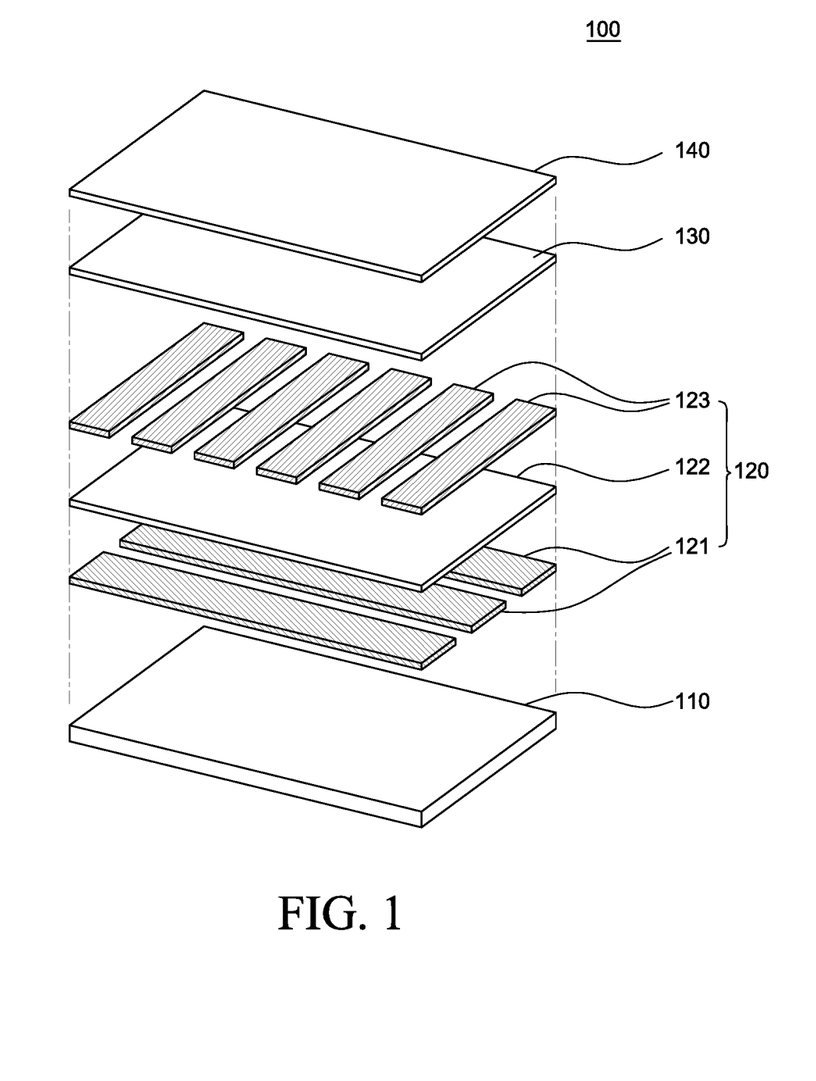
FIG. 1 is a schematic exploded perspective view illustrating a display device according to an embodiment of the present disclosure.
Figure 2:
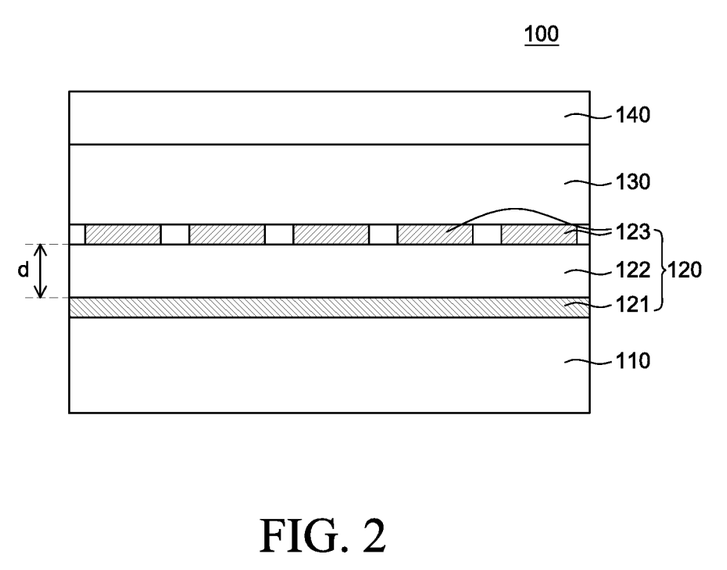
FIG. 2 is a schematic cross-sectional view illustrating a display device according to an embodiment of the present disclosure.

FIG. 1 is a schematic exploded perspective view illustrating a display device according to an embodiment of the present disclosure. FIG. 2 is a schematic cross-sectional view illustrating a display device according to an embodiment of the present disclosure. For convenience of description, respective constituent elements included in a display device 100 are schematically illustrated in quadrangular shapes and various constituent elements included in a display panel 110 are not illustrated in detail.

Referring to FIGS. 1 and 2, the display device 100 includes the display panel 110, a contact sensitive device 120, a linear polarizer 130, and a cover window 140.

The display panel 110 displays an image and includes a plurality of pixels. The pixel of the display panel 110 may be constituted by various elements. For example, in the case where the display device 100 is an organic light emitting display device, the pixel of the display panel 110 may include an organic light emission diode (OLED). Meanwhile, the pixel of the display panel 110 may further include a thin film transistor, a capacitor, and wires connected thereto in addition to the OLED.

The display panel 110 may have flexibility. In this case, pixels with a small thickness may be included on a substrate made of, for example, a polyester-based polymer, a silicon-based polymer, an acrylic polymer, a polyolefin-based polymer, and the like.

The display panel 110 may include at least one reflective layer. For example, in the case where the display panel 110 is an organic light emitting display panel used in a top emission type, an anode of the OLED included in the display panel 110 functions as a reflective layer. In this case, the anode of the OLED may be formed by a transparent conductive layer such as ITO and IZO and a reflective layer made of silver (Ag), nickel (Ni), gold (Au), platinum (Pt), aluminum (Al), copper (Cu), and molybdenum/aluminum neodymium (Mo/AlNd). In this case, the light emitted from the OLED is reflected on the reflective layer of the anode to be emitted in an upper direction of the display panel 110.

In the case where the display panel 110 is an organic light emitting display panel used in a bottom emission type, a cathode of the OLED functions as a reflective layer. In this case, the cathode of the OLED may be made of magnesium (Mg), silver (Ag), or an alloy thereof (MgAg). Since these materials have a high reflectivity, the anode or the cathode of the OLED may have a high reflectivity. However, the anode or the cathode of the reflective layer is not limited and all constituent elements of the display panel 110 having high reflectivity may be called the reflective layer. For example, a reflection may occur even on the surface of a color filter for implementing colors of the display panel 110, the surface of a black matrix for diving pixels, or the like, and all the constituent elements may be called the reflective layer.

The contact sensitive device 120 is disposed on the display panel 110 and generates a tactile feedback to generate a haptic effect in the display device 100. The contact sensitive device includes an electro-active layer 122, a plurality of first electrodes 121, and a plurality of second electrodes 123.

The plurality of first electrodes 121 and the plurality of second electrodes 123 are disposed on at least one surface of the electro-active layer 122 and may be disposed on the upper surface and the lower surface of the electro-active layer 122, as illustrated in FIGS. 1 and 2.

For example, the first electrodes 121 are disposed on the lower surface of the electro-active layer 122 and the second electrodes 123 are disposed on the upper surface of the electro-active layer 122. The first electrode 121 and the second electrode 123 may be extended in different directions, and different voltages may be applied to the first electrode 121 and the second electrode 123. The electro-active layer 122 may vibrate based on an electric field generated between the first electrode 121 and the second electrode 123 in a region where the first electrode 121 and the second electrode 123 cross each other.

According to some embodiments, the plurality of first electrodes 121 and the plurality of second electrodes 123 are disposed only on one surface of the electro-active layer 122. In this case, the first electrode 121 and the second electrode 123 are spaced apart from each other to be disposed on the same plane, and different voltages may be applied to the first electrode 121 and the second electrode 123. The electro-active layer 122 may vibrate based on an electric field generated by the first electrode 121 and the second electrode 123.

The plurality of first electrodes 121 and the plurality of second electrodes 123 may be made of conductive materials having an excellent transmittance. For example, the first electrode 121 and the second electrode 123 may be made of a transparent conductive material such as Indium tin oxide (no), PEDOT:PSS, and silver-nanowire (AgNW). Further, the first electrode 121 and the second electrode 123 may be constituted by a metal mesh. In this case, since light may be transmitted between metal lines having a mesh shape, the first electrode 121 and the second electrode 123 may be substantially transparent. The first electrode 121 and the second electrode 123 may be made of the same material or different materials. Each of the first electrode 121 and the second electrode 123 may be formed in a single-layered structure or a multi-layered structure made of the aforementioned material.

The electro-active layer 122 is a plate-shaped film made of electro-active polymers (EAPs) which are polymer materials which are transformed by an electrical stimulation. For example, the electro-active layer 122 may be made of polyvinylidene fluoride (PVDF)-based ferroelectric polymers. In detail, the electro-active layer 122 may be made of PVDF which is a homopolymer of a vinylidene fluoride (VF2) monomer or poly[(vinylidenefluoride-co-trifluoro-ethylene] (P(VDF-TrFE)). In a case in which the electro-active layer 122 is made of a ferroelectric polymer, when a voltage is applied to the electro-active layer 122, an arrangement direction of dipoles in the electro-active layer 122 changes and thus, the contact sensitive device 120 may vibrate.

The electro-active layer 122 may transfer a tactile feedback by a plurality of cell units. As illustrated in FIGS. 1 and 2, when the plurality of first electrodes 121 and the plurality of second electrodes 123 cross each other, the plurality of cells may be defined by regions where the plurality of first electrodes 121 and the plurality of second electrodes 123 cross each other. In this case, different voltages are applied to the plurality of first electrodes 121, respectively, and different voltages are applied to the plurality of second electrodes 123, respectively. As a result, different electric fields may be generated in cross regions where the plurality of first electrodes 121 and the plurality of second electrodes 123 cross each other. In this case, the electro-active layer 122 may vibrate with different frequencies in the crossed regions and transfer an independent tactile feedback by the plurality of cell units.

An area of each of the plurality of cells may be determined depending on a typical size of a user's finger. For example, each of the plurality of cells may have an area of 2 cm×2 cm. Since the electro-active layer 122 transfers a tactile feedback by the plurality of cell units, the contact sensitive device 120 may provide various and detailed haptic effects to the user.

The electro-active layer 122 may be uniaxially elongated in a predetermined direction. For example, the electro-active layer 122 may be uniaxially elongated by applying a tension to the electro-active layer 122 in a predetermined elongation-axial direction. The electro-active layer 122 is uniaxially elongated to have different refractive indexes depending on a direction of a crystal. A phase of light incident onto the electro-active layer 122 changes based on a crystalline refractive index anisotropy of the electro-active layer 122.

When the electro-active layer 122 is uniaxially elongated in a predetermined direction to have a refractive index anisotropy, the phase of light incident onto the electro-active layer 122 may be retarded. The display device 100 according to the embodiment of the present disclosure may suppress a reflection of an external light by using an optical characteristic of the electro-active layer 122. In detail, the electro-active layer 122 may function as a phase retardation film below the linear polarizer 130.

The electro-active layer 122 is desired to satisfy certain conditions so as to be used as an external light reflective film. Generally, an external light reflective film is formed by a structure of the linear polarizer 130, a phase retardation film, and the reflective layer. The phase retardation film is formed to retard the phase of an incident light having a wavelength of λ by λ/4. In this case, the light incident onto the linear polarizer 130 may become polarized in a vertical direction to the polarization axis of the linear polarizer 130 through the phase retardation film and the reflective layer and interrupted by the linear polarizer 130. As a result, an external light reflection may be reduced or minimized. Accordingly, the electro-active layer 122 disposed below the linear polarizer 130 may need to retard the phase of the incident light by λ/4 so as to function as a phase retardation film similar to a phase retardation film applied to a general external light reflection film. A phase retardation value of the electro-active layer 122 may be determined based on a thickness and an elongation rate of the electro-active layer 122.

In detail, the phase retardation value of the electro-active layer 122 satisfies the following Equation 1.

$$\frac{\lambda}{4} = \Delta n_{\mathit{eff}} \cdot d \qquad \text{[Equation 1]}$$

($\Delta n_{\mathit{eff}}$: effective refractive anisotropic value, d: thickness of electro-active layer, λ: wavelength of incident light)

In Equation 1, $\Delta n_{\mathit{eff}}$ represents the effective refractive anisotropic value of the electro-active layer 122 and may also be referred to as birefringence. The effective refractive anisotropic value of the electro-active layer 122 is an element representing a degree of refractive index anisotropy of the electro-active layer 122 and determined by components and an elongation rate of the electro-active layer 122.

As expressed in Equation 1, the phase retardation value λ/4 of the electro-active layer 122 is determined by the components and the elongation rate of the electro-active layer 122 which determine the effective refractive anisotropic value of the electro-active layer 122 $\Delta n_{eff}$, and a thickness d of the electro-active layer 122. The phase retardation value λ/4 of the electro-active layer 122 will be described below with reference to Table 1.

Meanwhile, the electro-active layer 122 has a high transmittance in order to reduce or minimize the decrease in the visibility of the display device 100. That is, the reflectivity of the electro-active layer 122 is low. For example, the reflectivity of the electro-active layer 122 may be smaller than 6%. In this case, most of the light incident to the electro-active layer 122 passes through the electro-active layer 122 and the phase may be retarded in the process of passing through the electro-active layer 122. A detailed description of the reflectivity of the electro-active layer 122 will be described below with reference to FIG. 4.

The linear polarizer 130 is disposed on the contact sensitive device 120. The linear polarizer 130 is implemented by a structure in which the polarizer is interposed between upper and lower support layers. The polarizer controls an amount of light that is transmitted depending on a degree of polarization of the incident light. The polarizer may be implemented by a film made of, for example, a poly vinyl alcohol (PVA) material and formed by elongating the PVA film absorbing iodine with a strong tension. Further, the support layers included above and below the polarizer may be implemented by a triacetyl cellulose (TAC) film for protecting and supporting the PVA film. However, the structure and the material of the linear polarizer 130 are not limited thereto, and at least one support layer may be omitted in the linear polarizer 130. A thin crystal film polarizer may also be formed by coating a polarizer on one support layer.

The linear polarizer 130 selectively transmits or absorbs a light having a predetermined polarization state from the incident light having various polarization states. For example, the linear polarizer 130 selectively transmits the light polarized in a direction parallel with the polarization axis.

The polarization axis of the linear polarizer 130 and the elongation axis of the electro-active layer 122 may form a predetermined angle. For example, the angle between the polarization axis of the linear polarizer 130 and the elongation axis of the electro-active layer 122 is about 45° or about 135°. Here, about 45° means one angle selected in a range of 43° to 47° and about 135° means one angle selected in a range of 133° to 137°. That is, a process error, which may be generated when the linear polarizer 130 is disposed on the contact sensitive device 120, is ±2°. As a result, the angle between the polarization axis of the linear polarizer 130 and the elongation axis of the electro-active layer 122 may be an angle selected in the range of 43° to 47° or an angle selected in the range of 133° to 137°. When the linear polarizer 130 and the electro-active layer 122 are disposed at the above angle, the external light reflection generated by the reflective layer of the display panel 110 may be reduced or minimized. This will be described below with reference to FIGS. 3A and 3B.

The cover window 140 is disposed on the linear polarizer 130. The cover window 140 is a substrate for protecting constituent elements of the display device 100 from an external environment. The cover window 140 may be constituted of glass having an excellent transmittance so as to transmit the light emitted from the display panel 110. In addition, the cover window 140 may be constituted by a film made of an organic material or an organic/inorganic composite material which has hardness of 5H or more and an excellent transmittance.

Although not illustrated in FIGS. 1 and 2, a first adhesive layer is disposed between the display panel 110 and the contact sensitive device 120 so as to adhere the display panel 110 and the contact sensitive device 120. In addition, a second adhesive layer is disposed between the contact sensitive device 120 and the linear polarizer 130 so as to adhere the contact sensitive device 120 and the linear polarizer 130. Further, a third adhesive layer may be disposed between the linear polarizer 130 and the cover window 140 so as to adhere the linear polarizer 130 and the cover window 140. The first to third adhesive layers may be made of a super view resin (SVR) or an optically clear adhesive (OCA) as an adhesive material having a high adhesion and a high light transmittance, but are not limited thereto.

The electro-active layer 122 of the contact sensitive device 120 included in the display device 100 according to the embodiment of the present disclosure may retard the phase of the incident light. As a result, the electro-active layer 122 may function as a phase retardation film. This will be described in more detail with reference to FIGS. 3A and 3B.

Figure 3A:
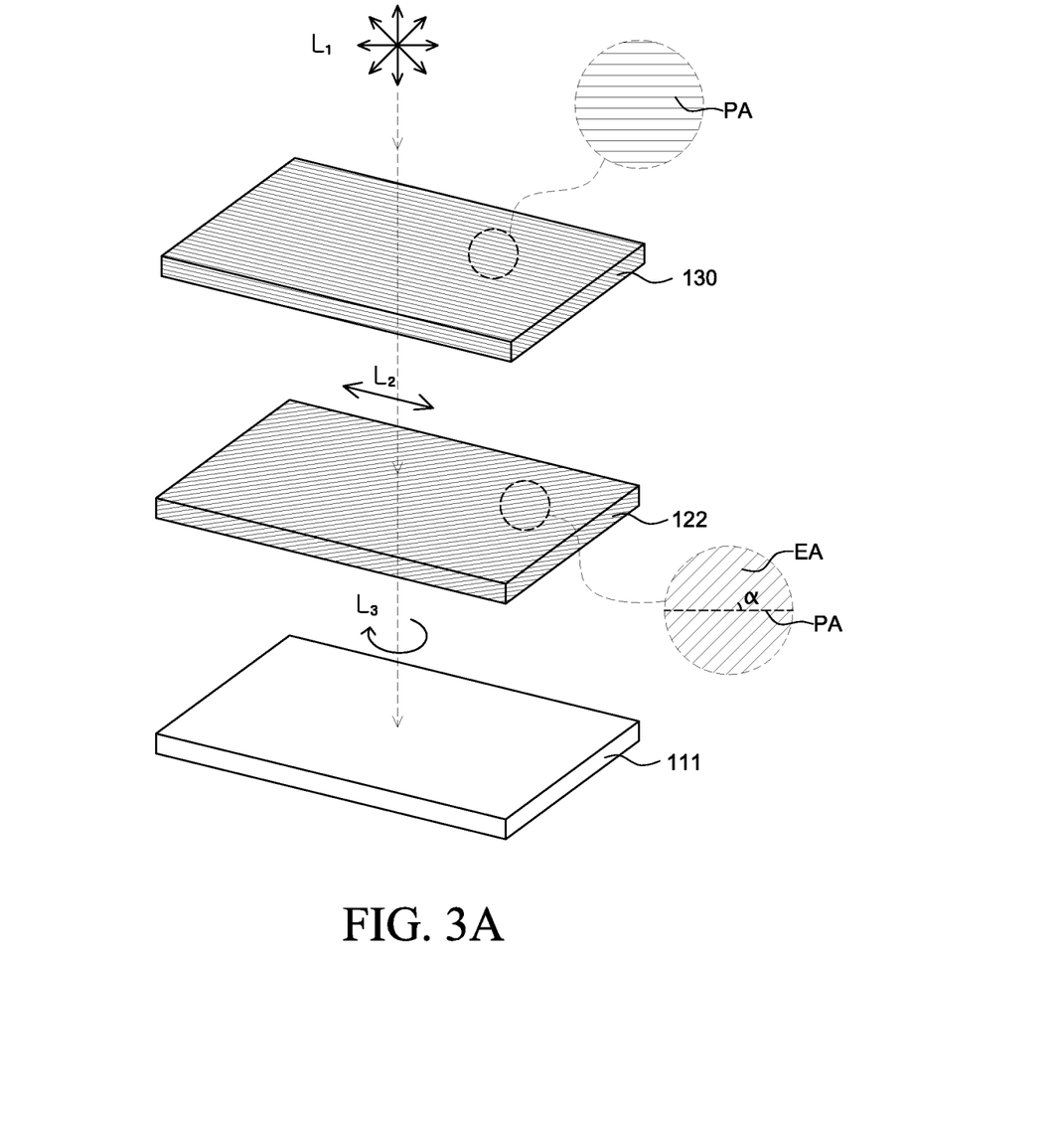
FIGS. 3A and 3B are schematic perspective views illustrating a phase retardation effect of an electro-active layer in a contact sensitive device of a display device according to an embodiment of the present disclosure.
Figure 3B:
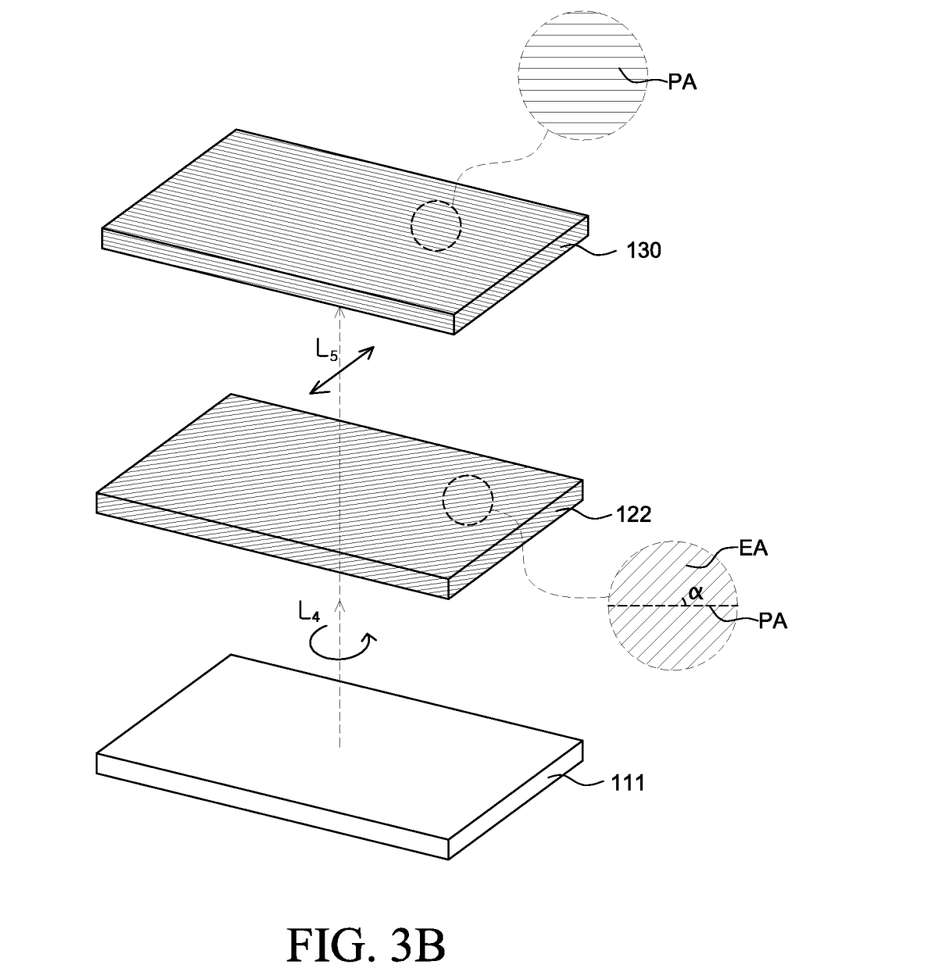

FIGS. 3A and 3B are schematic perspective views for describing a phase retardation effect of an electro-active layer included in a contact sensitive device of a display device according to an embodiment of the present disclosure. In FIGS. 3A and 3B, for convenience of description, constituent elements of the display device 100 other than the linear polarizer 130, the electro-active layer 122, and the reflective layer 111 of the display panel 110 are omitted. A travelling path of light is illustrated by a dotted arrow, and a polarization state of light is illustrated by a solid arrow. Further, in FIGS. 3A and 3B, for convenience of description, the shape of the reflective layer 111 is illustrated as a plate shape. Meanwhile, in FIGS. 3A and 3B, directions of a polarization axis PA of the linear polarizer 130 and an elongation axis EA of the electro-active layer 122 are illustrated with hatch.

Referring to FIG. 3A, a light $L_1$ input from an outside of the display device 100 is incident onto the linear polarizer 130 through the cover window 140 above the display device 100.

The light $L_1$ input from the outside of the display device 100 has various polarization states. The linear polarizer 130 selectively absorbs or transmits only a light $L_2$ having a predetermined polarization state from the light $L_1$ having various polarization states. As a result, the light $L_2$ passing through the linear polarizer 130 has the predetermined polarization state. For example, as illustrated in FIG. 3A, the linear polarizer 130 may transmit a light having a polarization state parallel with the polarization axis PA. Accordingly, the light $L_2$ passing through the linear polarizer 130 has a polarization state parallel with the polarization axis PA.

Subsequently, the light $L_2$ passing through the linear polarizer 130 is incident onto the electro-active layer 122 of the contact sensitive device 120. Since the second electrode 123 of the contact sensitive device 120 is made of a transparent conductive material, the light $L_2$ passing through the linear polarizer 130 may pass through the second electrode 123 of the contact sensitive device 120 and reach the electro-active layer 122 of the contact sensitive device 120.

As described above, the electro-active layer 122 may be uniaxially elongated in the elongation axis EA direction. An angle α between the elongation axis EA of the electro-active layer 122 and the polarization axis PA of the linear polarizer 130 is 45° or 135°. As described above, the electro-active layer 122 of the contact sensitive device 120 is implemented to retard the phase of the incident light. As a result, a phase of a light $L_3$ passing through the electro-active layer 122 of the contact sensitive device 120 is later than that of the light $L_2$ before passing through the electro-active layer 122. In this case, a transmittance of the electro-active layer 122 may be determined by the following Equation 2.

$$T = \sin^2(2\alpha) \cdot \sin^2\left(\frac{2\pi d \Delta n_{\it eff}}{\lambda}\right) \qquad \text{[Equation 2]}$$

(T: transmittance, α: angle (radian) between the polarization axis PA of the linear polarizer 130 and the elongation axis EA of the electro-active layer 122, d: thickness of the electro-active layer 122, $\Delta n_{\it eff}$: effective refractive anisotropic value of the electro-active layer 122, λ: wavelength of incident light)

If the angle α between the elongation axis EA of the electro-active layer 122 of the contact sensitive device 120 and the polarization axis PA of the linear polarizer 130 is 45° or 135° (that is, π/4 or 3π/4), a value of $\sin^2(2\alpha)$ in Equation 2 is 1. Meanwhile, when the thickness d and the elongation rate of the electro-active layer 122 are optimized to retard the phase of the incident light by λ/4, a value of $\sin^2(2\pi d\Delta n_{\it eff}/\lambda)$ in Equation 2 is 1. That is, since d·Δneff=λ/4 from Equation 1, $\sin^2(2\pi d\Delta n_{\it eff}/\lambda)=\sin^2(\pi/2)=1$. As a result, since the transmittance T in Equation 2 is 1, the light $L_2$ incident onto the electro-active layer 122 is fully transmitted and the phase thereof is retarded by λ/4.

Subsequently, the light $L_3$ passing through the electro-active layer 122 reaches the reflective layer 111 of the display panel 110. As described above, the reflective layer 111 means a constituent element capable of reflecting an external light due to a high reflectivity in the display panel 110. For example, the reflective layer 111 may be the anode of the OLED, various metal wires included in the display panel 110, a surface of a color filter for implementing colors of the display panel 110 and a surface of a black matrix for separating pixels of the display panel 110 from each other.

Referring to FIG. 3B, the light $L_3$ reaching the reflective layer 111 of the display panel 110 is reflected on the reflective layer 111. While the light $L_3$ reaching the reflective layer 111 of the display panel 110 is reflected on the reflective layer 111, the phase is changed to 180°. Accordingly, a phase of a light $L_4$ reflected on the reflective layer 111 has a difference of 180° from the phase of the light $L_3$ passing through the electro-active layer 122 of the contact sensitive device 120. Other constituent elements such as the first electrode 121 of the contact sensitive device 120 may be disposed between the electro-active layer 122 of the contact sensitive device 120 and the reflective layer 111 of the display panel 110. However, the constituent elements, which are disposed between the electro-active layer 122 of the contact sensitive device 120 and the reflective layer 111 of the display panel 110, have a high transmittance. As a result, most of the light $L_3$ passing through the electro-active layer 122 of the contact sensitive device 120 may reach the reflective layer 111 of the display panel 110.

Subsequently, the light $L_4$ reflected by the reflective layer 111 is incident onto the electro-active layer 122 of the contact sensitive device 120 again. While the light $L_4$ incident onto the electro-active layer 122 passes through the electro-active layer 122, the phase is retarded by λ/4 again. That is, the light $L_3$ which initially passes through the electro-active layer 122 of the contact sensitive device 120 has a phase which is retarded by λ/4 from the phase of the light $L_2$ which is initially incident onto the electro-active layer 122. In addition, the light $L_4$ reflected by the reflective layer 111 has a phase inverted at 180° (that is, π radian) from the phase of the light $L_3$ before reflection and a light $L_5$ passing through the electro-active layer 122 again has a phase retarded by λ/4 from the phase of the reflected light $L_4$. As a result, the light $L_5$ passing through the electro-active layer 122 again has the phase retarded by λ/2 from the phase of the light $L_2$ which is initially incident onto the electro-active layer 122 and becomes a light polarized in a vertical direction to the polarization axis of the linear polarizer 130.

Subsequently, the light $L_5$ passing through the electro-active layer 122 reaches the linear polarizer 130.

As described above, since the linear polarizer 130 transmits the light parallel with the polarization axis PA, the light $L_5$ passing through the electro-active layer 122 does not pass through the linear polarizer 130 and is interrupted by the linear polarizer 130. As a result, the external light reflection, in which the light $L_1$ input from the outside of the display device 100 is reflected to be emitted to the outside again, may be minimized, and thus, the visibility of the display device may be improved.

That is, the electro-active layer 122 retards the phase of the incident light $L_2$ by λ/4 and the elongation axis EA of the electro-active layer 122 and the polarization PA of the linear polarizer 130 is inclined at about 45° or about 135°. In this case, the light $L_1$ input from the outside is reflected again and not emitted to the outside. As described above, the phase retardation value of the electro-active layer 122 may be determined by the components, the elongation rate, and the thickness of the electro-active layer 122. As a result, the thickness and the elongation rate of the electro-active layer 122 may be optimized so that the electro-active layer 122 retards the phase by λ/4.

In detail, the thickness and the elongation rate of the electro-active layer 122 may be optimized so that the phase retardation value of the electro-active layer 122 is about λ/4. Here, about λ/4 includes an error range of ±5 nm at λ/4. That is, about λ/4 means one value selected from the range of λ/4−5 nm to λ/4+5 nm and is a value reflecting a minute error which may occur during the process.

Generally, when the electro-active layer 122 has the phase retardation value of λ/4−5 nm to λ/4+5 nm, the light $L_5$ reflected by the reflective layer 111 to pass through the electro-active layer 122 is almost interrupted by the linear polarizer 130. In addition, an amount of light which is leaked through the linear polarizer 130 can be minute and may not be viewed. However, when the phase retardation value of the electro-active layer 122 exceeds the range of λ/4−5 nm to λ/4+5 nm, some of the light $L_5$ which is reflected by the reflective layer 111 to pass through the electro-active layer 122 passes through the linear polarizer 130 that can be viewed from the outside. That is, the error range, which is available so that the electro-active layer 122 functions as a phase retardation film having the phase retardation value of λ/4, is λ/4−5 nm to λ/4+5 nm.

Table 1 shows data for determining optimal thicknesses for setting the phase retardation value of a PVDF film that is uniaxially elongated with four times the elongation rate as about λ/4.

TABLE 1

Incident | Phase retardation value of transmitting light for each film thickness
light | 28 μm | 40 μm | 80 μm | 110 μm | REF | λ/4
--- | --- | --- | --- | --- | --- | ---
550 nm | 100.83 nm | 134.15 nm | 290.57 nm | 404.19 nm | 140.15 nm | 137.50 nm
560 nm | 102.67 nm | 136.59 nm | 297.61 nm | 411.54 nm | 139.99 nm | 140.00 nm
570 nm | 103.85 nm | 139.02 nm | 302.92 nm | 418.89 nm | 140.14 nm | 142.50 nm
580 nm | 106.33 nm | 141.46 nm | 308.24 nm | 426.24 nm | 140.06 nm | 145.00 nm
590 nm | 108.17 nm | 143.90 nm | 313.55 nm | 436.89 nm | 139.46 nm | 147.50 nm
600 nm | 110.00 nm | 146.34 nm | 318.87 nm | 440.94 nm | 138.20 nm | 150.00 nm As shown in Table 1, when the thickness of the PVDF film is 40 μm, the phase of the incident light is retarded by about λ/4. That is, when the thickness of the PVDF film is 40 μm, the phase of the incident light is retarded by any one phase selected from the range of λ/4−5 nm to λ/4+5 nm. Particularly, it can be seen that the PVDF film which is uniaxially elongated with four times the elongation rate and has a thickness of 40 μm has substantially the same phase retardation effect as a general phase retardation film (REF). Here, a Cyclo Olefin Polymer® (COP) film of ZEON Corporation is used as the general phase retardation film.

In the display device 100 according to an embodiment of the present disclosure, the electro-active layer 122 is uniaxially elongated with a predetermined elongation rate so as to function as a phase retardation film and have a predetermined thickness. For example, the electro-active layer 122 may be uniaxially elongated with two times to six times the elongation rate and have a thickness of 20 μm to 110 μm. Preferably, when the electro-active layer 122 is made of PVDF, the electro-active layer 122 is uniaxially elongated with four times the elongation rate and has a thickness of 40 μm. In this case, the electro-active layer 122 has a phase retardation value of about λ/4 and may function as a phase retardation film for suppressing a reflection of an external light.

Meanwhile, in order to suppress the external light reflection with a phase retardation effect of the electro-active layer 122, the elongation axis EA of the electro-active layer 122 is inclined by a predetermined angle α with respect to the polarization axis PA of the linear polarizer 130. As described with reference to Equation 2, when the angle between the elongation axis EA of the electro-active layer 122 and the polarization axis PA of the linear polarizer 130 is 45° or 135°, $\sin^2(2\alpha)$ of Equation 2 becomes 1 and the external light reflection is reduced or minimized.

However, while forming the linear polarizer 130 and the electro-active layer 122, the angle α between the elongation axis EA and the polarization axis PA may have a minute error. When the angle α between the elongation axis EA of the electro-active layer 122 and the polarization axis PA of the linear polarizer 130 has an error within ±2° at 45° or 135°, $\sin^2(2\alpha)$ of Equation 2 sufficiently approximates to 1. As a result, the electro-active layer 122 may sufficiently suppress the external light reflection. On the contrary, when the angle α between the elongation axis EA of the electro-active layer 122 and the polarization axis PA of the linear polarizer 130 has an error beyond ±2° at 45° or 135°, $\sin^2(2\alpha)$ of Equation 2 may not sufficiently approximate to 1. As a result, some of the light $L_5$, which is reflected on the reflective layer 111 to pass through the electro-active layer 122, pass through the linear polarizer 130 that can be viewed from the outside.

Accordingly, the electro-active layer 122 of the display device 100 according to an embodiment of the present disclosure has the elongation axis EA which is inclined at about 45° or about 135° from the polarization axis PA of the linear polarizer 130. Here, about 45° means an angle selected in a range of 43° to 47° and about 135° means an angle selected in a range of 133° to 137°. As described above, the angle is to reflect an error of the angle α between the elongation axis EA of the electro-active layer 122 and the polarization axis PA of the linear polarizer 130 which may occur during the process. The elongation axis EA of the electro-active layer 122 and the polarization axis PA of the linear polarizer 130 are inclined at about 45° or about 135°. In this case, the light $L_5$, which is reflected on the reflective layer 111 to pass through the electro-active layer 122, may become a light which is almost vertically polarized from the polarization axis PA of the linear polarizer 130, and thus, the external light reflection may be efficiently suppressed.

Figure 4:
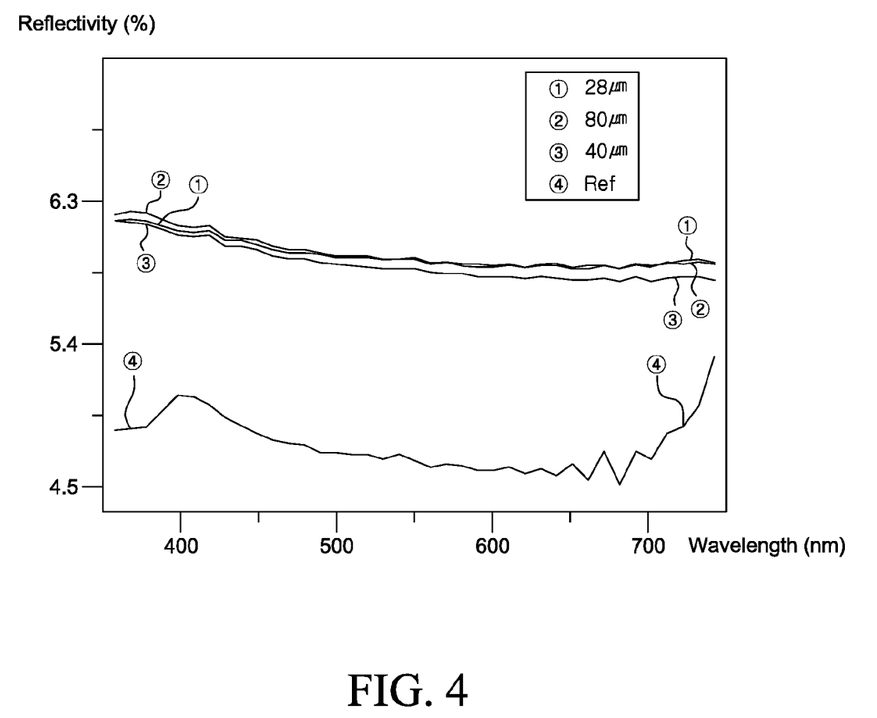
FIG. 4 is a graph showing a reflectivity of an electro-active layer of a display device according to an embodiment of the present disclosure.

FIG. 4 is a graph showing a reflectivity of an electro-active layer of a display device according to an embodiment of the present disclosure. The electro-active layer is desired to have a low reflectivity so as to be used as an external light reflective film. That is, when the reflectivity of the electro-active layer is high, the light passing through the linear polarizer may not pass through the electro-active layer and be reflected on the surface of the electro-active layer. Accordingly, the reflectivity of the electro-active layer is desired to be sufficiently low so that the light passing through the linear polarizer may pass through the electro-active layer.

In FIG. 4, a solid line ④ represents a reflectivity of a general phase retardation film as a comparative example. A Cyclo Olefin Polymer® (COP) film of ZEON Corporation is used for the general phase retardation film. The thickness of the general phase retardation film was 32 μm. Solid lines ①, ②, and ③ represent reflectivities of a PVDF film with a thickness of 28 μm, a PVDF film with a thickness of 80 μm, and a PVDF film with a thickness of 40 μm, respectively. The PVDF film with the thickness of 28 μm, the PVDF film with the thickness of 80 μm, and the PVDF film with the thickness of 40 μm are uniaxially elongated with four times the elongation rate. The elongation axis of the PVDF film was disposed to be inclined at about 45° from the polarization axis of the linear polarizer.

Referring to FIG. 4, the reflectivity of the general phase retardation film as a comparative example is 4.76% on average. On the contrary, the reflectivity of the PVDF film with the thickness of 40 μm is 5.88% on average. That is, the reflectivity of the PVDF film with the thickness of 40 μm has a difference of less than 2% from the reflectivity of the general phase retardation film. However, the difference in reflectivity of less than 2% may be difficult to be easily distinguished by the human eye and the PVDF film with the thickness of 40 μm may transmit most of light. As a result, it can be seen that the PVDF film may be sufficiently used as an alternative film of the phase retardation film.

Meanwhile, the reflectivity of the PVDF film with the thickness of 80 μm is 5.96% on average and the reflectivity of the PVDF film with the thickness of 28 μm is 5.94% on average. That is, the reflectivity of the PVDF film with the thickness of 80 μm and the reflectivity of the PVDF film with the thickness of 28 μm have the difference of less than 2% from the reflectivity of the general phase retardation film, respectively. As described above, the difference in reflectivity of less than 2% may be difficult to be easily distinguished by the human eye. However, the PVDF film with the thickness of 28 μm and the PVDF film with the thickness of 80 μm do not retard the phase of the incident light by about λ/4 as shown in Table 1. Accordingly, the PVDF film with the thickness of 28 μm and the PVDF film with the thickness of 80 μm may not be suitable for a phase retardation film in spite of their low reflectivities.

Still referring to FIG. 4, the 40 μm PVDF film, which is uniaxially elongated with four times the elongation rate, has slightly higher reflectivity than the general phase retardation film, but may retard the phase of the incident light by about λ/4. Since the difference in reflectivity between the PVDF film and the general phase retardation film may be difficult to be detected by the human eye, the effect of suppressing the external light reflection may be substantially the same. Particularly, since the PVDF film functions as the electro-active layer of the contact sensitive device, the PVDF film has an additional function of transferring a tactile feedback to the user. Accordingly, in the display device including the contact sensitive device, the general phase retardation film may be omitted, and the function of the phase retardation film may be replaced with the electro-active layer which is uniaxially elongated. As a result, the thickness of the display device may be decreased by the thickness of the omitted phase retardation film.

The display device 100 according to an embodiment of the present disclosure includes a contact sensitive device having the electro-active layer 122 which is uniaxially elongated to retard the phase of an incident light to transfer a tactile feedback to the user. In addition, a separate phase retardation film for suppressing the external light reflection may be omitted. Accordingly, as the phase retardation film is omitted, the thickness of the display device 100 may be decreased as much. As a result, the display device 100 may be thinner, and the flexible display device 100 may be more easily implemented. Since a process of separately attaching the phase retardation film below the linear polarizer 130, which is relatively expensive, the manufacturing costs of the display device 100 can be reduced.

Figure 5:
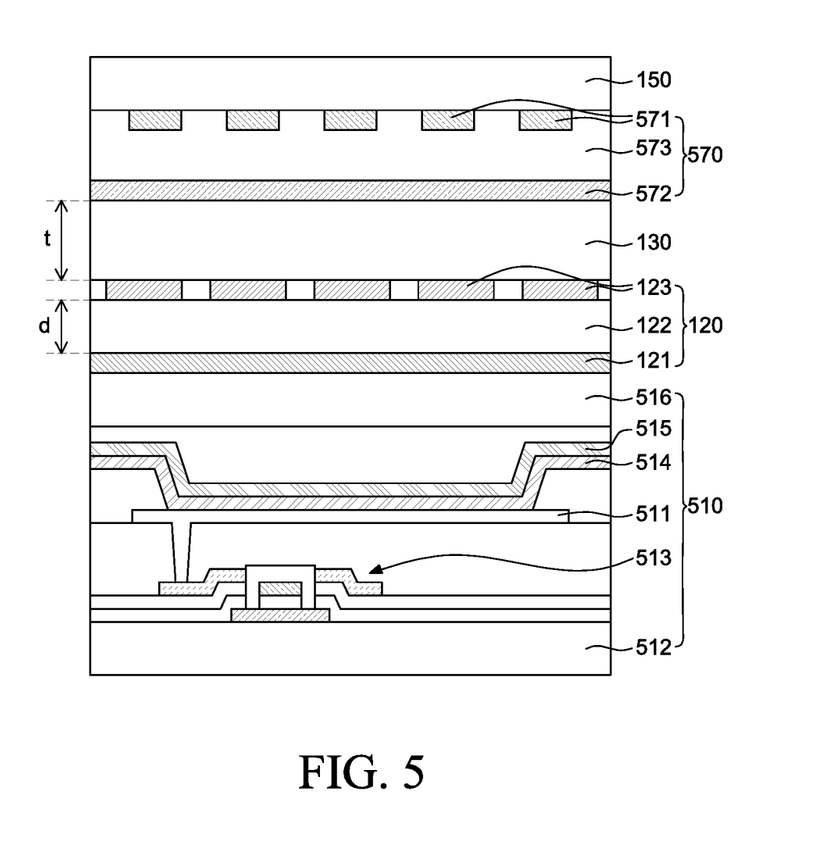
FIG. 5 is a schematic cross-sectional view illustrating a display device according to another embodiment of the present disclosure.

FIG. 5 is a schematic cross-sectional view illustrating a display device according to another embodiment of the present disclosure. A display device 500 illustrated in FIG. 5 is substantially the same as the display device 100 illustrated in FIGS. 1 and 2 except that a display panel 510 is an organic light emitting display panel and a touch panel 570 is disposed on a linear polarizer 130. Accordingly, a duplicated description thereof will be omitted.

The display panel 510 is implemented with an organic light emitting display panel including an organic light emission diode. In this case, the display panel 510 includes an organic light emission diode constituted by an anode 511, an organic light emitting layer 514, and a cathode 515 and a thin film transistor 513 constituted to transfer a driving current to the organic light emission diode. The organic light emission diode and the thin film transistor 513 are disposed on a lower substrate 512 of the display panel 510. An upper substrate 516 of the display panel 510 may protect the organic light emission diode and the thin film transistor 513 from an external environment.

In the case where the display panel 510 is a top emission type, the light emitted from the organic light emission diode propagates in an upper direction of the display device 100 through the upper panel 516. On the contrary, in the case where the display panel 510 is a bottom emission type, the light emitted from the organic light emission diode propagates in a lower direction of the display device 100 through the lower panel 512. FIG. 5 illustrates a top emission type organic light emitting display panel as an embodiment.

In the top emission type organic light emitting display panel, the anode 511 may be constituted as a reflective electrode so as to increase an emission efficiency of the light generated in the organic light emitting layer 514. In this case, the light generated in the upper direction of the organic light emitting layer 514 is immediately emitted toward the upper substrate 516, and the light generated in the lower direction of the organic light emitting layer 514 is reflected on the anode 511 to be emitted toward the upper substrate 516.

In this case, the anode 514 may function as a reflective layer. That is, the light input from the outside has a predetermined polarization state while passing through the linear polarizer 130 and the electro-active layer 122, and is reflected on the anode 511 to have an inverted polarization state. The light reflected through the anode 511 is interrupted by the electro-active layer 122 and the linear polarizer 130 again, and thus, the external light reflection may be reduced and minimized.

The touch panel 570 is disposed on the linear polarizer 130. The touch panel 570 detects a user's touch input on the display device 100. The touch panel 570 may be implemented by various types such as a resistive type, a capacitive type, an optical type, and an electromagnetic type. When the touch panel 570 is implemented with a capacitive type, the touch panel 570 includes a first touch electrode 571, a second touch electrode 572 electrically separated from the first touch electrode 571, and an insulating layer 573, as illustrated in FIG. 5. In this case, the touch panel 570 may detect a position of the user's touch input based on a change in capacitance between the first touch electrode 571 and the second touch electrode 572.

The linear polarizer 130 disposed below the touch panel 570 has a predetermined thickness t. For example, the linear polarizer 130 has a thickness of 100 μm or more. The linear polarizer 130 functions as a shielding layer so that a touch signal of the touch panel 570 can be shielded form interferences caused by an electric field applied to the electro-active layer 122 of the contact sensitive device 120. That is, the first touch electrode 571 or the second touch electrode 572 of the touch panel 570 may be charged by the electric field applied to the electro-active layer 122. In such a case, the touch signal may be deformed, or a signal delay may occur by the charged first touch electrode 571 or second touch electrode 572. However, in the display device 500 according to another embodiment of the present disclosure, the linear polarizer 130 having a thickness of 100 μm or more may shield the touch panel 570 from the electric field applied to the electro-active layer 122. As a result, interferences on the touch panel 570 caused by the electric field may be reduced or minimized.

Since the display device 500 according to another embodiment of the present disclosure includes the touch panel 570, a touch input may be recognized and an intuitive touch interface may be provided to the user. Particularly, the display device 500 according to another embodiment of the present disclosure includes the linear polarizer 130 disposed between the touch panel 570 and the contact sensitive device 120, and the linear polarizer 130 functions as a shielding layer. As a result, a separate shielding layer may not be needed. Accordingly, an increase in thickness of the display device 500 due to such a separate shielding layer can be reduced or minimized, and the thin display device 500 may be more easily implemented.

According to some embodiments, the touch panel 570 may further include a pressure sensor. The pressure sensor may measure an intensity of a touch input. For example, the thickness of the insulating layer 573 may be locally reduced at a point where the user's touch input is applied. In addition, as the thickness of the insulating layer 573 changes, capacitances among the insulating layer 573, the first touch electrode 571, and the second touch electrode 572 may also change. The pressure sensor may measure an intensity of a touch input by detecting a change in capacitance. In this case, the touch panel 570 may measure the intensity of the touch input as well as a two-dimensional position of the touch input. As a result, the display device 500 may receive various touch inputs and provide various tactile feedbacks according to the intensity of the touch input in cooperation with the contact sensitive device 120.

Figure 6:
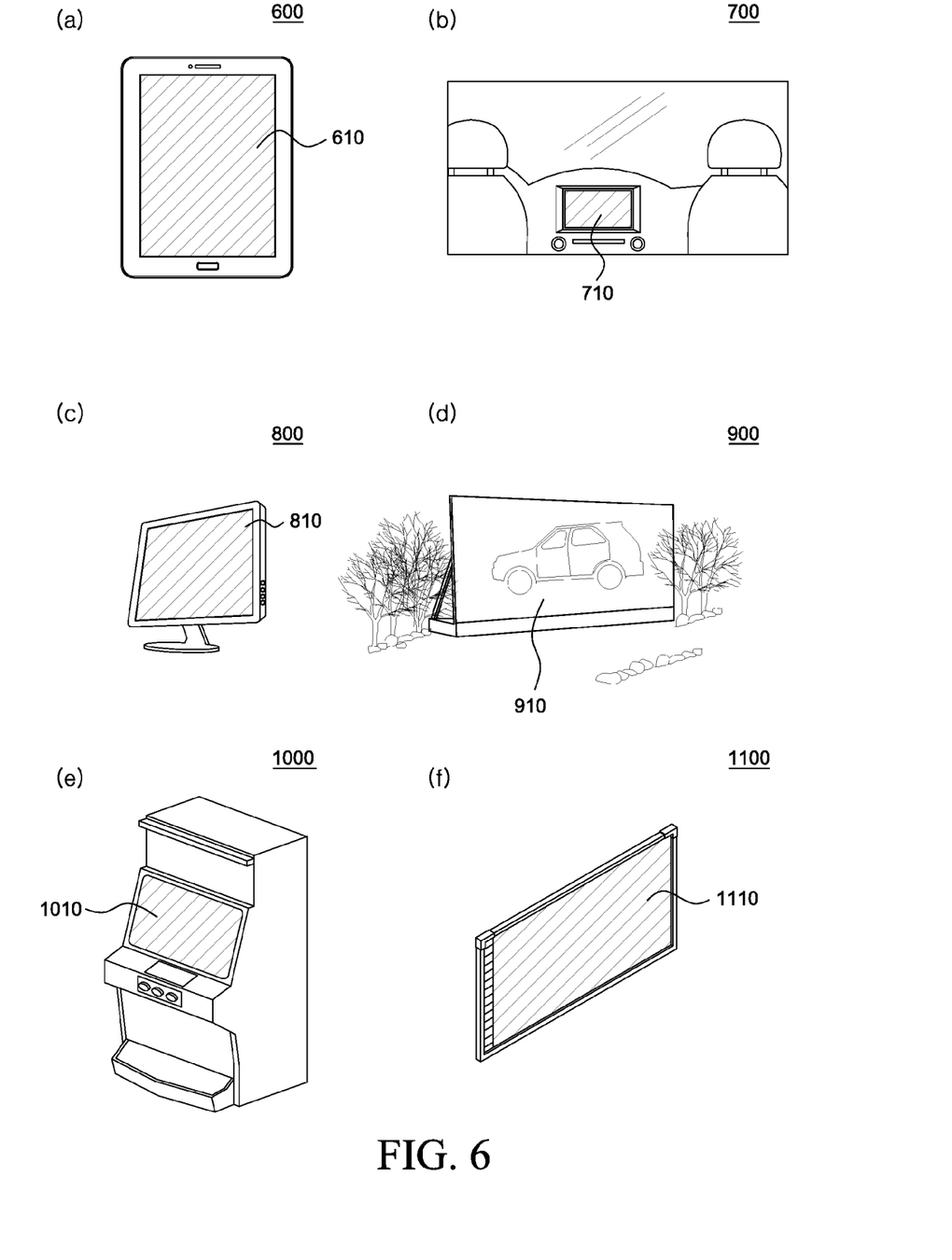
FIG. 6 is a diagram illustrating examples in which display devices according to various embodiments of the present disclosure may be advantageously used.

FIG. 6 is a diagram illustrating examples in which display devices according to various embodiments of the present disclosure may be advantageously used. FIG. 6A illustrates a case where a display device 610 according to an embodiment of the present disclosure is used in a mobile device 600. Here, the mobile device 600 means a compact device such as a smart phone, a portable phone, a tablet PC, and a PDA. When the display device 610 is installed in the mobile device 600, the user directly applies a touch input on the screen of the display device 610 to perform various functions of the mobile device 600.

Particularly, the display device 610 according to the embodiment of the present disclosure includes a contact sensitive device having a thin film shape. As a result, the mobile device 600 may provide various tactile feedbacks in response to the user's touch input. For example, the user may feel a vibration together with the touch and transfer more sensible information with the mobile device 600 when performing motion picture viewing, games, a button input, and the like. Further, it may be easy to reduce the thickness and weight of the mobile device 600 and implement the flexible mobile device 600.

FIG. 6B illustrates a case where a display device according to an embodiment of the present disclosure is used in a vehicle navigation system 700. The vehicle navigation system 700 may include a display device 710 and a plurality of operating elements and may be controlled by a processor installed in the vehicle. When the display device 710 is applied to the vehicle navigation system 700, a height of a road, a condition of the road, a progress situation of the vehicle, and the like may be tactually provided. As a result, a driver may more easily operate the vehicle navigation system 700.

FIG. 6C illustrates a case where a display device according to an embodiment of the present disclosure is used as a display means 800 such as a monitor and a TV. When a display device 810 according to an embodiment of the present disclosure is used as the display means 800, the user may perform various functions of the display means 800 by directly applying the touch input on the screen of the display device 810. In addition, the user may feel a tactile of an object displayed on the display means 800 based on a tactile feedback provided by the display means 800. As a result, the user may enjoy a more realistic image, and blind people may also enjoy various contents through a tactile experience. Particularly, the contact sensitive device of the display device 810 according to an embodiment of the present disclosure has a function of suppressing an external light reflection. As a result, even in the case of viewing the display means 800 in an light ambient, a reduction in visibility of the display means 800 due to an external light may be reduced or minimized.

FIG. 6D illustrates a case where a display device according to an embodiment of the present disclosure is used in an outdoor billboard 900. The outdoor billboard 900 may include a display device 910 and a supporter connecting the ground and the display device 910. When the display device 910 according to an embodiment of the present disclosure is applied to the outdoor billboard 900, information on advertisement objects to be sold is transferred through visual and auditory media and furthermore, may be transferred through tactile media. Accordingly, the user may receive tactile information for the advertisement objects by touching the outdoor billboard 900, and thus an advertisement effect may be maximized. Particularly, the contact sensitive device of the display device 910 has the function of suppressing the external light reflection to further improve visibility of the outdoor billboard 900.

FIG. 6E illustrates a case where display devices according to various embodiments of the present disclosure are used in a game machine 1000. The game machine 1000 may include a display device 1010 and a housing in which various processors are embedded. When a display device 1010 according to an embodiment of the present disclosure is applied to the game machine 1000, the user may operate a game by directly touching the screen of the display device 1010 and thus, the operation of the game may be easy. Since various tactile feedbacks are realistically provided to the user, user engagements in the game may be doubled. Particularly, the contact sensitive device of the display device 1010 has a function of suppressing an external light reflection and thus, the user may view the screen of the game machine 1000 from the outside without much inconvenience.

FIG. 6F illustrates a case where a display device according to an embodiment of the present disclosure is used in an electronic whiteboard 1100. The electronic whiteboard 1100 may include a display device 1110, a speaker, and a structure for protecting the display device 1110 and the speaker from external impact. When the display device 1110 according to the embodiment of the present disclosure is applied to the electronic whiteboard 1100, an educator may feel as though he or she is directly writing on the whiteboard when inputting lecture contents on the display device 1110 by a stylus pen or a finger. Further, when an educatee applies the touch input for the image displayed on the electronic whiteboard 1100, a tactile feedback suitable for the corresponding image may be provided to the educatee, and thus, the educational effect may be improved.

Steps of the method or the algorithm described in association with the embodiments disclosed in the specification may be directly implemented by hardware and software modules executed by a processor, or a combination thereof. The software module may reside in storage media such as a RAM memory, a flash memory, a ROM memory, an EPROM memory, an EEPROM memory, a register, a hard disk, a removable disk, and a CD-ROM or a predetermined storage medium of a difference type known to those skilled in the art. The exemplary storage medium is coupled to the processor and the processor may read information from the storage medium and write the information in the storage medium. Alternatively, the storage medium may be integrated with the processor. The processor and the storage medium may reside in an application specific integrated circuit (ASIC). The ASIC may reside in a user terminal. Alternatively, the processor and the storage medium may reside in the user terminal as individual components.

Although the embodiments of the present disclosure have been described in detail with reference to the accompanying drawings, the present disclosure is not limited thereto and may be embodied in many different forms without departing from the technical concept of the present disclosure. Therefore, the embodiments disclosed in the present disclosure are used to not limit but describe the technical spirit and the scope of the technical spirit of the present disclosure is not limited by the embodiments. Therefore, the aforementioned embodiments are all illustrative and are not restricted to a limited form. The scope of the present disclosure may be interpreted by the appended claims and the technical spirit in the equivalent range are intended to be embraced by the present disclosure.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A display device comprising:
    a display panel;
    a contact sensitive device to generate a haptic effect of transferring a tactile feedback in response to touch input on the display panel; and
    a linear polarizer on the contact sensitive device,
    wherein the contact sensitive device includes an electro-active layer that retards a phase of an incident light, and
    wherein the electro-active layer is uniaxially elongated.

2. The display device according to claim 1, wherein the electro-active layer is configured to retard the phase of the incident light by about 4-5 nm to λ/4+5 nm, where λ is a wavelength of the incident light.

3. The display device according to claim 1, wherein the electro-active layer includes a polyvinylidene fluoride (PVDF)-based polymer.

4. The display device according to claim 3, wherein the electro-active layer is a film which is uniaxially elongated, and the thickness of the electro-active layer is 40 μm.

5. The display device according to claim 1, wherein the display panel is an organic light emitting display panel including a reflective layer.

6. The display device according to claim 5, wherein the reflective layer includes at least one of an anode, a cathode, a metal wire, a surface of a color filter and a surface of a black matrix.

7. The display device according to claim 1, wherein the contact sensitive device further includes an electrode disposed on at least one surface of the electro-active layer.

8. The display device according to claim 7, further comprising:
    a touch panel disposed on the linear polarizer, wherein a thickness of the linear polarizer is 100 μm or more.

9. A display device comprising:
    a display panel;
    a linear polarizer on the display panel; and
    a contact sensitive device between the display panel and the linear polarizer, the contact sensitive device having an electro-active layer that has an elongation axis inclined at an angle greater than zero from a polarization axis of the linear polarizer.

10. The display device according to claim 9, wherein the contact sensitive device further includes an electrode disposed on at least one surface of the electro-active layer, and wherein the elongation axis of the electro-active layer is inclined at 43° to 47° or 133° to 137° from the polarization axis of the linear polarizer.

11. The display device according to claim 10, wherein the electro-active layer is a film which is uniaxially elongated.

12. The display device according to claim 10, wherein a thickness d of the electro-active layer and an effective refractive anisotropic value Δneff of the electro-active layer satisfy the following Equation 1

$$\frac{\lambda}{4} = \Delta n_{\mathit{eff}} \cdot d. \qquad \text{[Equation 1]}$$

* * * * *